(12) United States Patent
Han et al.

(10) Patent No.: US 9,299,749 B2
(45) Date of Patent: Mar. 29, 2016

(54) ORGANIC LIGHT-EMITTING DISPLAY APPARATUS AND METHOD OF MANUFACTURING THE SAME

(71) Applicant: Samsung Display Co., Ltd., Yongin, Gyeonggi-do (KR)

(72) Inventors: Kyul Han, Yongin (KR); Hyo-Yeon Kim, Yongin (KR); Hye-Yeon Shim, Yongin (KR); Sang-Woo Lee, Yongin (KR); Heun-Seung Lee, Yongin (KR); Sang-Woo Pyo, Yongin (KR); Ji-Hwan Yoon, Yongin (KR); Gyeong-Hui Hwang, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/082,048

(22) Filed: Nov. 15, 2013

(65) Prior Publication Data

US 2015/0021559 A1    Jan. 22, 2015

(30) Foreign Application Priority Data

Jul. 18, 2013  (KR) .................... 10-2013-0084933

(51) Int. Cl.
*H01L 51/56* (2006.01)
*H01L 27/32* (2006.01)
*H01L 51/52* (2006.01)

(52) U.S. Cl.
CPC ............ *H01L 27/322* (2013.01); *H01L 51/524* (2013.01); *H01L 51/5281* (2013.01)

(58) Field of Classification Search
CPC ............................ H01L 51/5237; H01L 51/56

USPC ............ 257/40, 98, E51.022; 313/503, 504, 313/506; 438/29
See application file for complete search history.

(56) References Cited

U.S. PATENT DOCUMENTS

| 5,239,228 | A * | 8/1993 | Taniguchi et al. ............. 313/512 |
| 7,029,807 | B2 * | 4/2006 | Sakurada et al. .................. 430/7 |
| 7,129,634 | B2 * | 10/2006 | Boroson et al. ............... 313/504 |
| 2004/0140762 | A1 | 7/2004 | Tohma et al. |
| 2005/0073247 | A1 * | 4/2005 | Yamazaki et al. ............. 313/503 |
| 2005/0146266 | A1 * | 7/2005 | Kuma et al. .................... 313/506 |
| 2006/0012288 | A1 * | 1/2006 | Terakado et al. ............. 313/503 |
| 2006/0128252 | A1 * | 6/2006 | Menda et al. .................... 445/25 |

(Continued)

FOREIGN PATENT DOCUMENTS

| KR | 10-2004-0065183 A | 7/2004 |
| KR | 10-2008-0030175 A | 4/2008 |
| KR | 10-2013-0019932 A | 2/2013 |

OTHER PUBLICATIONS

*Flat-Panel Display Market and Slimming Technology Trend I In Display Panel Slimming Technology*, Korea Institute of Science and Technology Information, Aug. 2012, with English translation (17 pages).

*Primary Examiner* — Sheng Zhu
(74) *Attorney, Agent, or Firm* — Lewis Roca Rothgerber Christie LLP (57) ABSTRACT

An organic light-emitting display apparatus includes a display substrate, a display panel on the display substrate and including a pixel region including an organic light-emitting device (OLED), and a non-pixel region, and an encapsulation substrate for encapsulating the display panel, wherein the encapsulation substrate defines at least one groove therein in which a color filer is located.

19 Claims, 7 Drawing Sheets

(56) References Cited

U.S. PATENT DOCUMENTS

| | | |
|---|---|---|
| 2007/0207623 A1 | 9/2007 | Hiroki |
| 2009/0072693 A1* | 3/2009 | Cok et al. .................. 313/110 |
| 2011/0140373 A1* | 6/2011 | Lee et al. .................. 277/628 |

* cited by examiner

ORGANIC LIGHT-EMITTING DISPLAY APPARATUS AND METHOD OF MANUFACTURING THE SAME

CROSS-REFERENCE TO RELATED APPLICATION

This application claims priority to and the benefit of Korean Patent Application No. 10-2013-0084933, filed on Jul. 18, 2013, in the Korean Intellectual Property Office, the disclosure of which is incorporated herein in its entirety by reference.

BACKGROUND

1. Field

One or more embodiments of the present invention relate to an organic light-emitting display apparatus and a method of manufacturing the same.

2. Description of the Related Art

An organic light-emitting display apparatus is a self-emission display that includes organic light-emitting diodes (OLED), each of which including a hole injection electrode, an electron injection electrode, and an organic light-emitting layer formed therebetween. The organic light-emitting display apparatus emits light when an exciton, which is generated when a hole injected from the hole injection electrode and an electron injected from the electron injection electrode are combined, drops from an excitation state to a ground state.

Because the organic light-emitting display apparatus, which is a self-emission display, does not need an additional power source, it may be driven with a low voltage, and it may be formed as a light film. Additionally, the organic light-emitting display apparatus provides high-quality characteristics such as wide viewing angles, high contrast, and rapid responses. Thus, the organic light-emitting display apparatus has gained a lot of attention as a next-generation display apparatus.

SUMMARY

One or more embodiments of the present invention include an organic light-emitting display apparatus that employs a color filter having enhanced color reproduction and a method of manufacturing the same.

Additional aspects of embodiments of the present invention will be set forth in part in the description that follows and, in part, will be apparent from the description, or may be learned by practice of the presented embodiments.

According to one or more embodiments of the present invention, an organic light-emitting display apparatus includes a display substrate, a display panel on the display substrate and including a pixel region including an organic light-emitting device (OLED), and a non-pixel region, and an encapsulation substrate for encapsulating the display panel, wherein the encapsulation substrate defines at least one groove therein in which a color filer is located.

The pixel region may include a first pixel, a second pixel, and a third pixel, the first, second, and third pixels being configured to emit light of different colors, and the at least one groove may correspond to the first pixel, the second pixel, or the third pixel.

The organic light-emitting display apparatus may further include a color filter corresponding to the color emitted by the first pixel located in the at least one groove, wherein the at least one groove is above the first pixel.

The first pixel may be a blue pixel.

The at least one groove may include a first groove corresponding to the first pixel, a second groove corresponding to the second pixel, and a third groove corresponding to the third pixel, and color filters respectively corresponding to the colors emitted by the first pixel, the second pixel, and the third pixel may be located in the first groove, the second groove, and the third groove, respectively.

The at least one groove may be defined by an exterior of the encapsulation substrate.

The organic light-emitting display apparatus may further include a filling member configured to protect the display panel located between the display panel and the encapsulation substrate, wherein the at least one groove is defined by a side of the encapsulation substrate facing the display substrate.

The organic light-emitting display apparatus may further include a black matrix corresponding to the non-pixel region located on the encapsulation substrate.

The organic light-emitting display apparatus may further include a polarizing film on the encapsulation substrate.

The organic light-emitting display apparatus may further include an encapsulation member surrounding the display panel, and bonding the display substrate to the encapsulation substrate.

The organic light-emitting display apparatus may further include a moisture absorbent at a side of the display panel.

A depth of the at least one groove may be in a range of about 0.1 um to about 1000 um.

According to one or more embodiments of the present invention, a method of manufacturing an organic light-emitting display apparatus, the method including forming a display panel on a display substrate, bonding the display substrate to an encapsulation substrate, forming a groove in the encapsulation substrate, and forming a color filter in the groove, wherein the display panel includes a pixel region including an OLED, and a non-pixel region.

The pixel region may include a first pixel, a second pixel, and a third pixel, wherein the first, second, and third pixels are configured to emit different colors, and wherein the groove corresponds to the first pixel, the second pixel, or the third pixel.

Forming the groove may include wet etching.

The method may further include performing a slimming operation for reducing thicknesses of the display substrate and the encapsulation substrate.

Forming the groove and performing the slimming operation may occur substantially simultaneously.

Performing the slimming operation may include reducing the thicknesses of the display substrate and the encapsulation substrate by about 40% to about 60%.

Forming the color filter may include an inkjet printing method.

Bonding the display substrate to the encapsulation substrate may include coating an encapsulation member on the display substrate, orienting the display substrate and the encapsulation substrate to face each other, and irradiating laser onto a region of the encapsulation substrate corresponding to the encapsulation member.

BRIEF DESCRIPTION OF THE DRAWINGS

These and/or other aspects will become apparent and will be more readily appreciated from the following description of the embodiments, taken in conjunction with the accompanying drawings in which.

DETAILED DESCRIPTION

The present disclosure will now be described more fully with reference to the accompanying drawings, in which exemplary embodiments of the invention are shown. Like reference numerals in the drawings denote like elements, and thus their description will be omitted. In the drawings, the lengths and sizes of elements may be exaggerated for clarity and convenience of description.

This invention may be embodied in many different forms and should not be construed as limited to the exemplary embodiments set forth herein. For example, it will be understood that when a layer is referred to as being "on" or "on the top of" another layer, the layer can be directly on another layer, or one or more intervening layers may be present.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes," and/or "including," when used herein, specify the presence of stated steps, operations, and/or elements, but do not preclude the presence or addition of one or more other steps, operations, and/or elements. It will be understood that, although the terms, 'first', 'second', etc. may be used herein to describe various elements, these elements should not be limited by these terms. Instead, these terms are only used to distinguish one element from another.

When a certain embodiment may be implemented differently, a described process order may be performed in an order differently from that which is described. For example, two consecutively described processes may be performed substantially at the same time, or may be performed in an order different than, or opposite to, the described order. As used herein, the term "and/or" includes any and all combinations of one or more of the associated listed items. Expressions such as "at least one of," when preceding a list of elements, modify the entire list of elements, and do not modify the individual elements of the list.

Figure 1A:
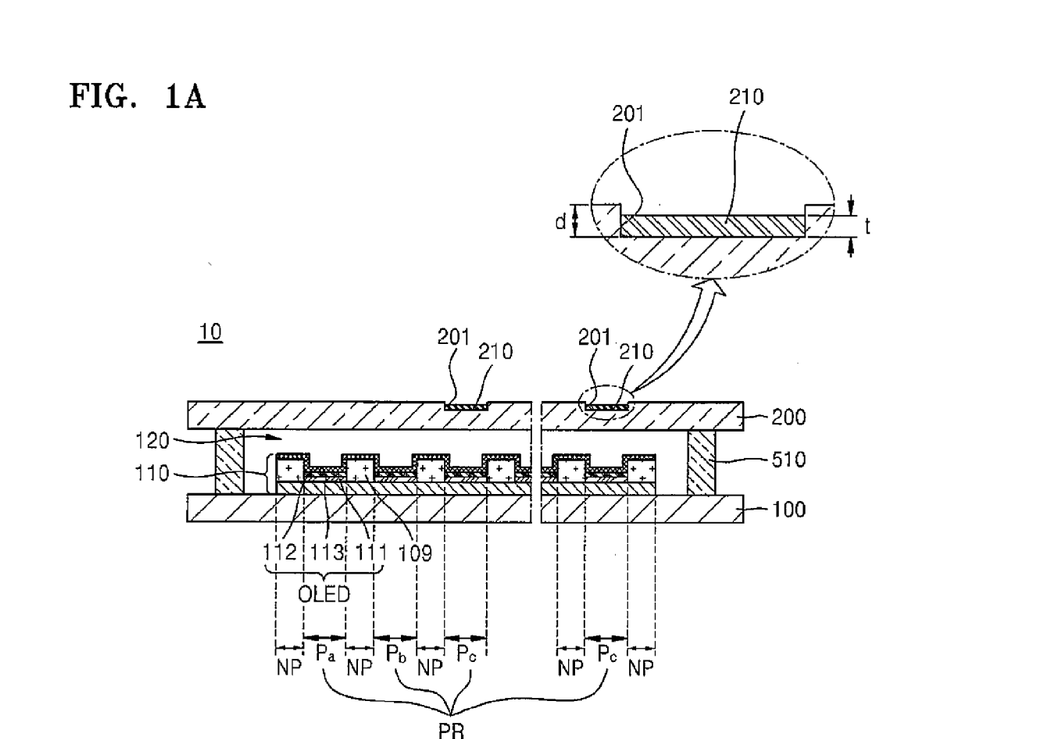
FIG. 1A is a schematic cross-sectional view of an organic light-emitting display apparatus according to an embodiment of the present invention.
Figure 1B:
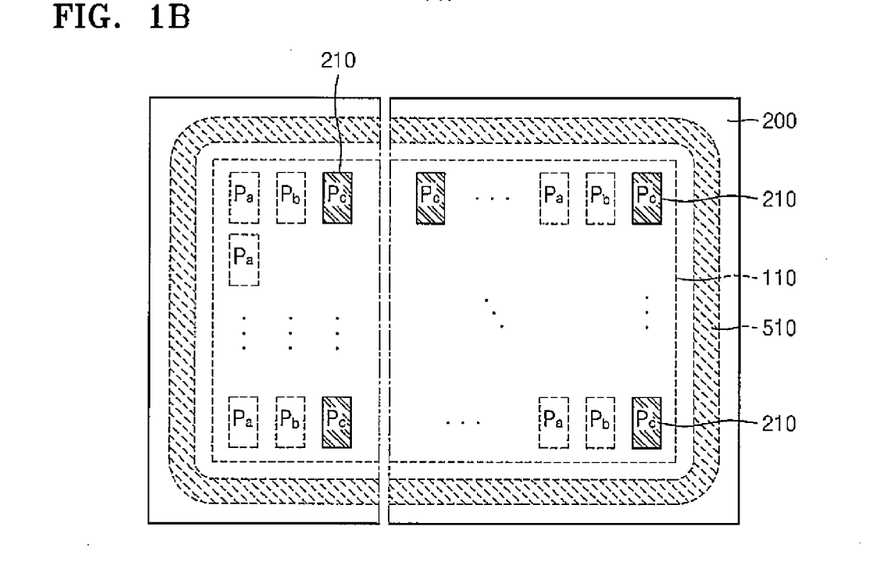
FIG. 1B is a schematic plan view of the organic light-emitting display apparatus of FIG. 1A.
Figure 2:
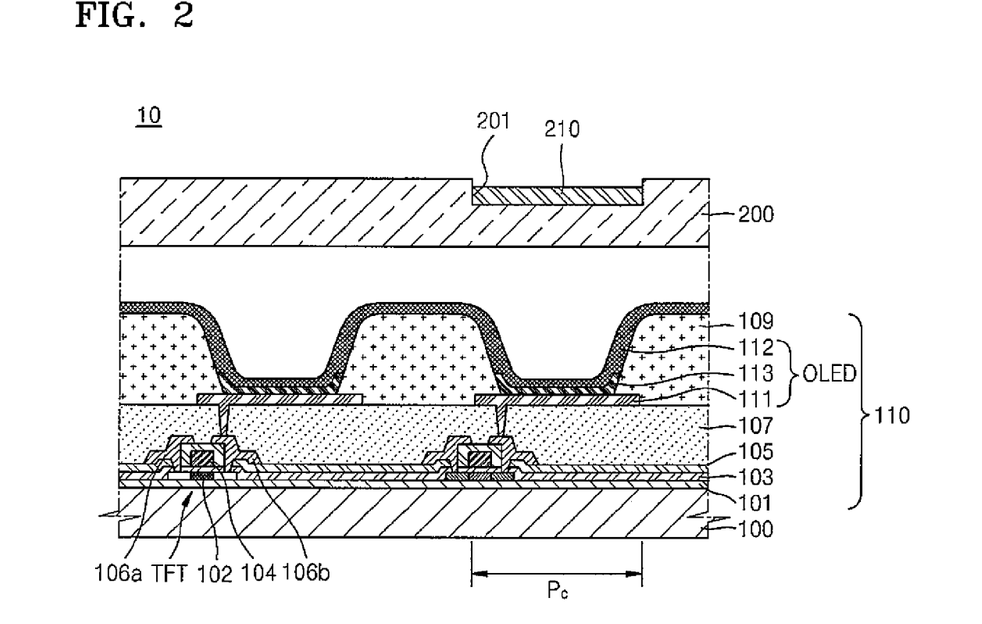
FIG. 2 is a schematic enlarged cross-sectional view of a part of the organic light-emitting display apparatus of FIG. 1A.

FIG. 1A is a schematic cross-sectional view of an organic light-emitting display apparatus 10 according to an embodiment of the present invention. FIG. 1B is a schematic plan view of the organic light-emitting display apparatus 10 of FIG. 1A. FIG. 2 is a schematic enlarged cross-sectional view of a part of the organic light-emitting display apparatus 10 of FIG. 1A.

Referring to FIGS. 1A and 1B, the organic light-emitting display apparatus 10 includes a display substrate 100, a display panel 110, and an encapsulation substrate 200. The encapsulation substrate 200 includes a groove 201 in which a color filter 210 is located. The organic light-emitting display apparatus 10 may further include an encapsulation member 510.

The display panel 110 is provided on the display substrate 100, and includes a pixel region PR, in which an organic light-emitting device (OLED) is provided, and a non-pixel region NP that separates the pixel regions PR from each other.

The pixel regions PR may include a first pixel Pa, a second pixel Pb, and a third pixel Pc, which are configured to emit light of different colors. For example, the first pixel Pa may be a red pixel, the second pixel Pb may be a green pixel, and the third pixel Pc may be a blue pixel, although the colors of the pixels are not limited thereto. For example, the pixel regions PR may include white pixels. Also, the pixel regions PR may include a white pixel in addition to the red, green, and blue pixels.

The first pixel Pa, the second pixel Pb, and the third pixel Pc may be aligned in various shapes or arrangements. For example, a pixel alignment structure of FIG. 1B may have a stripe shape in which a plurality of pixels having the same color are aligned in a row unit, or a column unit, although the pixel alignment structure is not limited thereto. For example, the pixel alignment structure may have a pentile matrix shape in which the first pixel Pa and the second pixel Pb are alternately aligned in the same row, and in which the third pixel Pc is aligned in an adjacent row. The pixel regions PR may have various shapes such as rectangular shapes, hexagonal shapes, polygonal shapes, circular shapes, oval shapes, and the like.

The encapsulation substrate 200 is located to face the display substrate 100 and encapsulates the display panel 110. The encapsulation substrate 200 blocks/protects the display panel 110, including the OLED, from external moisture and air. The encapsulation substrate 200 may use a substrate formed of various plastic materials such as acryl, and the display substrate 100 may be formed of various materials, such as a glass material.

The groove 201, in which the color filter 210 is located, is formed in the encapsulation substrate 200, and may be provided to selectively correspond to at least one of the pixel regions PR. In embodiments of the present invention, the color filter 210 may be provided to satisfy a color reproduction of the organic light-emitting display apparatus 10.

In general, to achieve the color reproduction of a display apparatus, three primary colors emitted from the display apparatus satisfy a standard color space (for example, a color coordinate of sRGB, such as a coordinate according to a CIE xy diagram). For example, a standard CIE xy coordinate of a red pixel is (0.64, 0.33), a standard CIE xy coordinate of a green pixel is (0.30, 0.60), and a standard CIE xy coordinate of a blue pixel is (0.15, 0.06).

Accordingly, the color reproduction of the organic light-emitting display apparatus 10 may be achieved when a color coordinate of light emitted from the organic light-emitting display apparatus 10 is identical to, or is similar to, the standard color coordinate. The self-emissive organic light-emitting display apparatus 10 may satisfy the standard color coordinate using a color coordinate of light emitted by an organic emissive layer 113 of FIG. 2. However, because a lifespan of, or an electrical characteristic of, the organic emissive layer 113 is considered in addition to the color coordinate, it may be difficult to satisfy/achieve the intended standard color coordinate when only using the organic emissive layer 113. Thus, the color filter 210 may be used to control the color coordinate by being located in a pixel region in which it is relatively difficult to achieve the color coordinate by only using the organic emissive layer 113. Accordingly, the color filter 210 may implement a full color image, may improve color purity, and may enhance exterior visibility.

In some embodiments of the present invention, the groove 201, in which the color filter 210 is located, may correspond to at least one of the first pixel Pa, the second pixel Pb, and the third pixel Pc. For example, the groove 201, in which the color filter 210 is located, may be provided to correspond to the first pixel Pa. The color filter 210 may implement the same color as the color emitted by the first pixel Pa. In this regard, the first pixel Pa may be a blue pixel, although the first pixel Pa is not limited thereto, and may instead be a red pixel or a green pixel.

In some embodiments, the groove 201 containing the color filter 210 may be provided to correspond to two of the first pixel Pa, the second pixel Pb, and the third pixel Pc. In the present embodiment, the color filter 210 may implement different colors according to corresponding pixels, and may satisfy a value of the standard color coordinate according to each pixel.

The groove 201 in which the color filter 210 is located may be formed in an upper portion of the encapsulation substrate 200. That is, the groove 201 may be in a side of the encapsulation substrate 200 facing away from the display panel 110. Accordingly, the color filter 210 formed of an organic solvent may be removed from, and thereby prevented from influencing, or negatively effecting, the display panel 110.

The color filter 210 may include a dye/pigment and the organic solvent. The pigment may be an organic pigment or an inorganic pigment. In some embodiments of the present invention, the inorganic pigment may include at least one selected from the group consisting of titanium oxide, barium sulfate, calcium carbonate, zinc oxide, titanium nitride, lead, sulphate, zinc, iron oxide III, cadmium, chromium oxide, cobalt, titanium, carbon, and any combinations thereof. In some embodiments of the present invention, the organic solvent may include at least one selected from the group consisting of N-methylpyrrolidone, ethylene glycol monobutyl ether, propylene glycol monomethyl ether, propylene glycol monomethyl ether acetate, and any combinations thereof.

A depth d of the groove 201, in which the color filter 210 is located, may correspond to a minimum depth by which the color filter 210 may work and/or an intensity of light that passes through the color filter 210. The depth d may be designed in consideration of a processing condition for forming the color filter 210. The depth d of the groove 201 may be in the range of about 0.1 um to about 1000 um.

The groove 201 may be formed by dry etching or wet etching. In some embodiments of the present invention, the groove 201 may be formed during a slimming process for reducing a thickness of the encapsulation substrate 200, although the present invention is not limited thereto. For example, the groove 201 may be formed by imprint lithography.

A thickness t of the color filter 210 may be different than the depth d of the groove 201. For example, the thickness t of the color filter 210 may be less than the depth d of the groove 201.

Because the color filter 210 is located in the groove 201 in the encapsulation substrate 200, the organic light-emitting display apparatus 10 may be light and thin.

The encapsulation member 510 may surround the display panel 110, and may function to bond the display substrate 100 to the encapsulation substrate 200. The encapsulation member 510 may function to block/protect the display panel 110, including the OLED, from external moisture and air. The encapsulation member 510 may be sealing, glass, frit, etc., which are commonly used.

An inner space 120 defined by the display substrate 100, the encapsulation substrate 200, and the encapsulation member 510 may be in a vacuum state, although the qualities of the inner space 120 are not limited thereto. For example, the inner space 120 may be filled with nitrogen (N2), or may further include a filling material, which may protect the display panel 110 from external shock, and which may be formed of an insulating material.

The construction of the organic light-emitting display apparatus 10 will be described in detail with reference to FIG. 2.

The display substrate 100 may be formed of a transparent glass material having silicon dioxide ($SiO_2$) as a main component. However, the display substrate 100 is not limited thereto, and may be formed of a transparent plastic material. The plastic material forming the display substrate 100 may be an insulating organic substance selected from the group consisting of polyethersulfone (PES), polyacrylate (PAR), polyetherimide (PEI), polyethylene naphthalate (PEN), polyethylene terephthalate (PET), polyphenylene sulfide (PPS), polyallylate, polyimide, polycarbonate (PC), cellulose triacetate (TAC), and cellulose acetate propionate (CAP).

In a bottom emissive type display apparatus, in which an image is formed in a direction toward the display substrate 100, the display substrate 100 may be formed of a transparent material. In a top emissive type display apparatus, in which an image is formed in a direction away from the display substrate 100, the display substrate 100 need not be formed of the transparent material, and may instead be formed of a ceramic or metallic material. For example, the display substrate 100 may include at least one selected from the group consisting of carbon, iron, chromium, manganese, nickel, titanium, molybdenum, and stainless steel but is not limited thereto. The display substrate 100 may use a substrate formed of a metal foil.

An auxiliary layer 101, such as a barrier layer, a blocking layer, and/or a buffer layer, may be located on the display substrate 100 to prevent spread of impurity ions, prevent inflow of moisture or external air, and planarize an upper surface of the display substrate 100. The auxiliary layer 101 may be formed of silicon oxide ($SiO_2$), silicon nitride ($SiN_x$) and/or silicon oxynitride ($SiO_xN_y$) by using various deposition methods, such as plasma-enhanced chemical vapor deposition (PECVD), atmospheric pressure chemical vapor deposition (APCVD), low pressure CVD (LPCVD), and the like. The auxiliary layer 101 is not necessarily indispensable, and may be omitted according to circumstances.

The display panel 110 is provided on the display substrate 100 and includes a thin film transistor (TFT) and the OLED. In FIG. 2, one TFT is provided for each pixel. However, this is merely for convenience of description and embodiments of the present invention are not limited to one TFT provided for each pixel, and a plurality of TFTs and a storage capacitor may be further provided.

The TFT is electrically coupled to the OLED to drive the OLED. The TFT of FIG. 2 is a top gate type TFT and sequentially includes an active layer 102, a gate electrode 104, a source electrode 106a, and a drain electrode 106b. Although the top gate type TFT is described in the present embodiment, embodiments of the present invention are not limited to a type of the TFT of FIG. 2 and it will be understood by one of ordinary skill in the art that various types of TFTs may be employed.

The active layer 102 may be formed by forming and patterning an inorganic semiconductor such as silicon and an oxide semiconductor, or an organic semiconductor on the display substrate 100 provided on the auxiliary layer 101.

In some embodiments, the active layer 102 may be formed of silicon. In this case, the active layer 102 may be formed to include a source region, a drain region, and a channel region between the source region and the drain region by forming and crystallizing an amorphous silicon layer on the display substrate 100, forming and patterning a polycrystalline silicon layer, and doping the source region and the drain region at an edge of the channel region with impurities.

In another embodiment, the active layer 102 may be formed of the oxide semiconductor. For example, the oxide semiconductor may include an oxide of a material selected from metal elements in groups 12 through 14 of the periodic table including of zinc (Zn), indium (In), gallium (Ga), stannum/tin (Sn), cadmium (Cd), germanium (Ge), and hafnium (Hf), and any combinations thereof.

A source region and a drain region are formed at respective edges of the active layer 102, and may be electrically coupled to the source electrode 106a and the drain electrode 106b, respectively. A gate insulating layer 103 is formed on the active layer 102. A gate electrode 104 is formed on the gate insulating layer (e.g., on a predetermined region of the gate insulating layer) 103, and is electrically coupled to a gate line via which on/off signals of the TFT may be applied.

An interlayer insulating layer 105 is formed on the gate electrode 104. The source electrode 106a and the drain electrode 106b respectively contact the source region and the drain region of the active layer 102 through contact holes in the interlayer insulating layer 105.

The gate insulating layer 103 and the interlayer insulating layer 105 may be formed of an insulating material. For example, the gate insulating layer 103 and the interlayer insulating layer 105 may be formed in a stacked structure of a single layer or of multiple layers including an inorganic material, an organic material, or a combination thereof. In some embodiments, the gate insulating layer 103 and the interlayer insulating layer 105 may be formed of $SiN_x$ or $SiO_2$.

A planarization layer 107 may cover and protect the TFT and/or may remove a phase difference and planarize the OLED to thereby increase emission efficiency of the OLED formed on the TFT. The planarization layer 107 may include an inorganic insulating layer and/or an organic insulating layer. The inorganic insulating layer may include $SiO_2$, SiNx, SiON, $Al_2O_3$, $TiO_2$, $Ta_2O_5$, $HfO_2$, $ZrO_2$, BST, PZT, etc. The organic insulating layer may include general purpose polymers, such as polymethyl methacrylate (PMMA) and polystyrene (PS), polymer derivatives having a phenolic group, acrylic polymers, imide polymers, aryl ether polymers, amide polymers, fluorinated polymers, p-xylene polymers, vinyl alcohol polymers, and their blends. The planarization layer 107 may also be formed in a stacked structure of a single layer or of multiple layers including an inorganic material and an organic material.

The OLED is provided in a pixel region and in an emissive region on the planarization layer 107. The emissive region and a non-emissive region will be described with respect to a pixel-defining layer 109.

The OLED includes an anode electrode 111, which is electrically coupled to one of the source electrode 106a and the drain electrode 106b of the TFT, a cathode electrode 112 formed to face the anode electrode 111, and an organic emissive layer 113 interposed therebetween.

The anode electrode 111 of the OLED is formed on the planarization layer 107, and the pixel-defining layer 109 is formed to cover the anode electrode 111 formed of an insulating material. The pixel-defining layer 109 may be formed by using resin, such as polyacrylate, polyimide, benzocyclobutene, or phenol, or a silica-based inorganic material. In some embodiments, the pixel-defining layer 109 may be formed by using a spin coating method.

An opening (e.g., a predetermined opening) that exposes a center portion of the anode electrode 111 is formed in the pixel-defining layer 109, and the organic emissive layer 113 of the OLED is formed in a region of the opening. Then, the cathode electrode 112 of the OLED is formed to cover all pixels (e.g., as a common electrode).

A pixel is defined by the opening of the pixel-defining layer 109. One OLED is located for each pixel. That is, an emissive region is formed at the opening of the pixel-defining layer 109 by the organic emissive layer 113, and is separated from adjacent emissive regions by the pixel-defining layer 109, which is a non-emissive region. In this regard, the emissive region is a pixel region, and the non-emissive region is a non-pixel region.

The anode electrode 111 may be a transparent electrode or a reflective electrode. If the anode electrode 111 is formed as the transparent electrode, the anode electrode 111 may include ITO, IZO, ZnO, or $In_2O_3$. Otherwise, if the anode electrode 111 is formed as the reflective electrode, the anode electrode 111 may include a reflective layer formed of Ag, Mg, Al, Pt, Pd, Au, Ni, Nd, Ir, Cr, or a compound thereof, and a transparent layer formed of ITO, IZO, ZnO, or $In_2O_3$. In some embodiments, the anode electrode 111 may be formed as a reflective electrode with a structure of ITO/Ag/ITO.

The cathode electrode 112 may also be formed as a transparent electrode or as a reflective electrode. If the cathode electrode 112 is formed as the transparent electrode, the cathode electrode 112 may include a layer formed to face the organic emissive layer 113 by depositing Li, Ca, LiF/Ca, LiF/Al, Al, Mg, or a compound thereof, and may also include an auxiliary electrode or a bus electrode line formed of a transparent conductive material such as ITO, IZO, ZnO, or $In_2O_3$ on the layer facing the organic emissive layer 113. If the cathode electrode 112 is formed as the reflective electrode, the cathode electrode 112 may be formed of Li, Ca, LiF/Ca, LiF/Al, Al, Mg, or a compound thereof. In some embodiments of the present invention, the anode electrode 111 and the cathode electrode 112 may be switched with each other.

A low-molecular weight organic material or a polymer organic material may be employed as the organic emissive layer 113, which is located between the anode electrode 111 and the cathode electrode 112. When the organic emissive layer 113 is formed of the low-molecular weight organic material, a hole injection layer (HIL), a hole transport layer (HTL), an electron transport layer (ETL), and/or an electron injection layer (EIL), may be stacked to form a single or multiple structure, having the organic light-emitting layer 113 therebetween. Various organic materials, such as copper phthalocyanine (CuPc), N,N'-Di(naphthalene-1-yl)-N,N'-diphenyl-benzidine (NPB), or tris-8-hydroxyquinoline aluminum (Alq3), may be used to form the organic emissive layer 113. The low-molecular weight organic material may be formed on masks by using a vacuum deposition method.

When the organic emissive layer 113 is formed of the polymer organic material, the HTL may be included between the organic emissive layer 113 and the anode electrode 111. The HTL may be formed of poly(3,4-ethylenedioxythiophene) (PEDOT), and the organic emissive layer 113 may be formed of a polymer organic material, such as polyphenylene vinylene (PPV) or polyfluorene. The organic emissive layer 113 may emit red, green, blue, or white light.

Although the organic emissive layer 113 of FIG. 2 is located in the opening of the pixel-defining layer 109, the present invention is not limited thereto. For example, the organic emissive layer 113 may be formed on the anode electrode 111 in the opening of the pixel-defining layer 109, and may also be partially located between the pixel-defining layer 109 and the cathode electrode 112.

According to the above-described embodiment, as an example, the organic emissive layer 113 is formed in the opening, and separate light-emitting materials are formed for each pixel. However, the present invention is not limited thereto. The organic emissive layer 113 may also be formed on the entire planarization layer 107, regardless of a location of pixels. In this regard, the organic emissive layer 113 may be formed to emit the white light by mixing light-emitting materials that emit red, green, and blue lights. The organic emissive layer 113 may be formed by vertically stacking layers that emit red, green, and blue light, or by mixing or stacking light-emitting material layers including various colors that may emit white light.

A protection layer may be further provided on the OLED to cover and protect the OLED.

As described above, the encapsulation substrate 200 of the organic light-emitting display apparatus 10 includes the groove 201 containing the color filter 210 that may be selectively located according to a pixel type. Accordingly, a color reproduction of the organic light-emitting display apparatus 10 may be enhanced. The color filter 210 may be located outside (e.g., in the groove on the side of the encapsulation substrate 200 facing away from the OLED) to prevent an organic material forming the color filter 210 from influencing, or degrading, the OLED. The color filter 210 is included in the encapsulation substrate 200 instead of being included as a separate member, and thus the organic light-emitting display apparatus 10 may be lightweight and thin.

Figure 3:
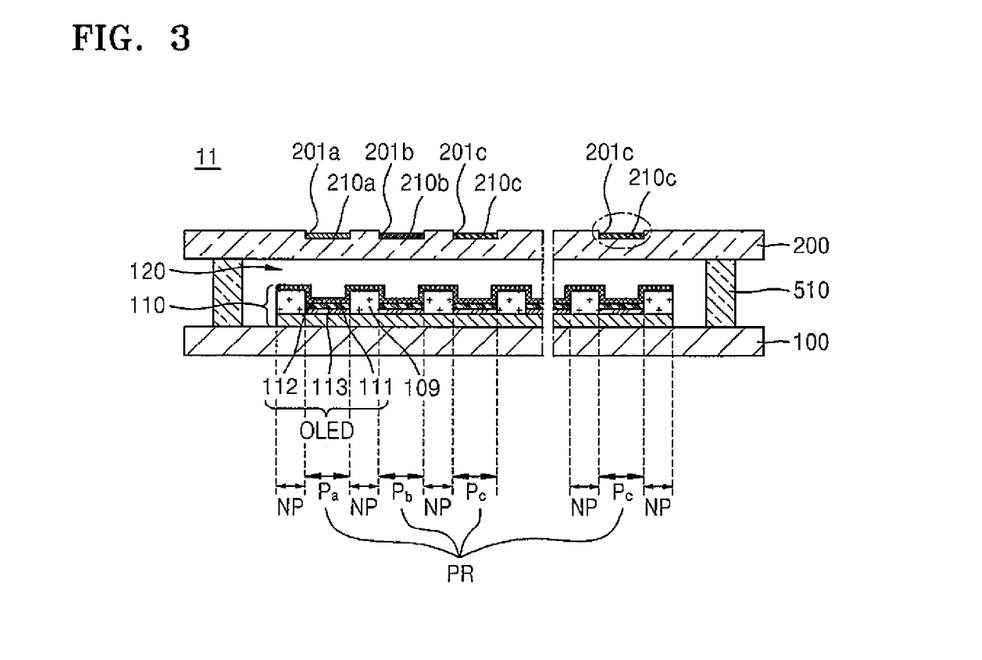
FIG. 3 is a schematic cross-sectional view of an organic light-emitting display apparatus according to another embodiment of the present invention.

FIG. 3 is a schematic cross-sectional view of an organic light-emitting display apparatus 11 according to another embodiment of the present invention. The reference numerals of FIG. 3 that are the same as those of FIG. 1 denote the same elements as those of FIG. 1, and thus redundant descriptions thereof are omitted for brevity of explanation.

Referring to FIG. 3, the organic light-emitting display apparatus 11 of the present embodiment is different from the organic light-emitting display apparatus 10 of FIG. 1 in that the organic light-emitting display apparatus 11 of the present embodiment includes a first groove 201a, a second groove 201b, and a third groove 201c formed in/defined by the encapsulation substrate 200. The first groove 201a, the second groove 201b, and the third groove 201c respectively correspond to the first pixel Pa, the second pixel Pb, and the third pixel Pc.

One or more color filters 210a, 210b, and 210c may be located in one or more of the first groove 201a, the second groove 201b, and the third groove 201c. In other words, there may be one of the first groove 201a, the second groove 201b, and the third groove 201c in which none of the color filters 210a, 210b, and 210c are located. In some embodiments, the first color filter 210a, which corresponds to the same color as that emitted by the first pixel Pa, is located only in the first groove 201a, while no color filter is located in the second groove 201b and the third groove 201c.

In other embodiments, the first color filter 210a, which corresponds to the same color as that emitted by the first pixel Pa, may be located in the first groove 201a, while the second color filter 210b, which corresponds to the same color as that emitted by the second pixel Pb, may be located in the second groove 201b, and while the third color filter 210c, which corresponds to the same color as that emitted by the third pixel Pc, may be located in the third groove 201c.

The first through third color filters 210a, 210b, and 210c may have different thicknesses.

It may be determined whether and how to apply the first through third color filters 210a, 210b, and 210c to the organic light-emitting display apparatus 11 of FIG. 3 according to results obtained by testing a color coordinate characteristic of the organic light-emitting display apparatus 11 before forming the first through third color filters 210a, 210b, and 210c, and by uniformly preparing the first groove 201a, the second groove 201b, and the third groove 201c.

Figure 4:
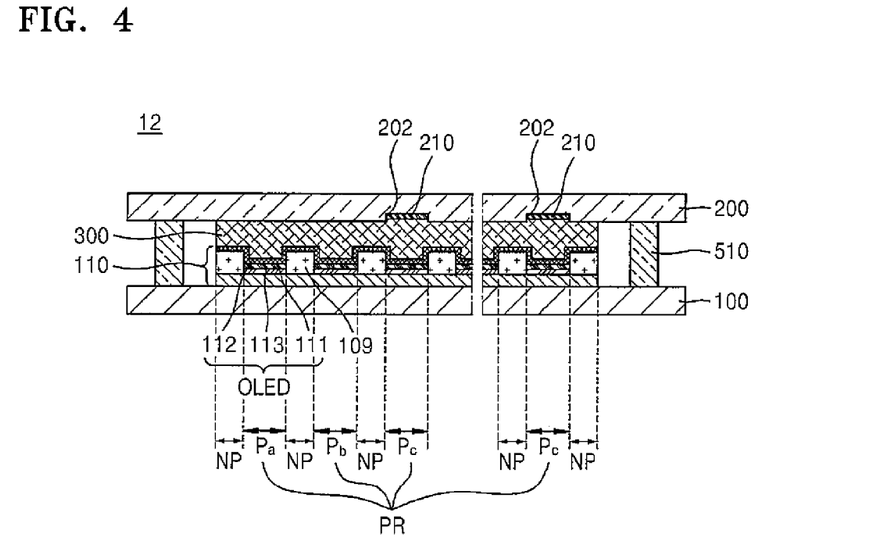
FIG. 4 is a schematic cross-sectional view of an organic light-emitting display apparatus according to another embodiment of the present invention.

FIG. 4 is a schematic cross-sectional view of an organic light-emitting display apparatus 12 according to another embodiment of the present invention. The reference numerals of FIG. 4 that are the same as those of FIG. 1 denote the same elements as those of FIG. 1, and thus redundant descriptions thereof are omitted for brevity of explanation.

Referring to FIG. 4, the organic light-emitting display apparatus 12 of the present embodiment is different from the organic light-emitting display apparatus 10 of FIG. 1 in that the organic light-emitting display apparatus 12 includes a groove 202 formed in the encapsulation substrate 200 (e.g., at a side of the encapsulation substrate 200 facing the inner space 120). The organic light-emitting display apparatus 12 further includes a filling material 300 for protecting the display panel 110.

The filling material 300 may function to block an organic material of the color filter 210 from influencing/effecting the display panel 110. The filling material 300 may function to protect the display panel 110 from external moisture or oxygen, and from external shock. The filling material 300 may be formed as an organic layer and an inorganic layer. In some embodiments, the filling material 300 may be formed of urethane resin that is an organic sealant, epoxy-based resin, acrylate resin, or silicon that is an inorganic sealant. For example, urethane acrylate may be used as the urethane resin. For example, butyl acrylate, ethylhexyl acrylate, etc. may be used as the acrylate resin. In some embodiments, the filling material 300 may be polyimide. In some embodiments, the filling material 300 may be formed in a stack structure including the organic layer and the inorganic layer.

Figure 5:
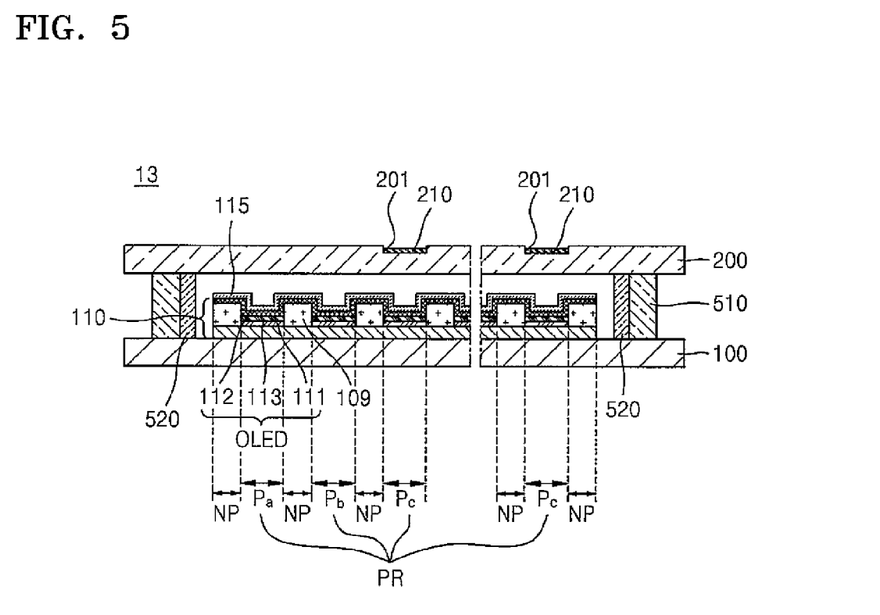
FIG. 5 is a schematic cross-sectional view of an organic light-emitting display apparatus according to another embodiment of the present invention.

FIG. 5 is a schematic cross-sectional view of an organic light-emitting display apparatus 13 according to another embodiment of the present invention. The reference numerals of FIG. 5 that are the same as those of FIG. 1 denote the same elements as those of FIG. 1, and thus redundant descriptions thereof are omitted for brevity of explanation.

Referring to FIG. 5, the organic light-emitting display apparatus 13 is different from the organic light-emitting display apparatus 10 of FIG. 1 in that the organic light-emitting display apparatus 13 of the present embodiment further includes a protection layer 115 and/or a moisture absorbent 520 that protect the OLED.

The protection layer 115 is provided on the OLED and the cathode electrode 112, and may function to cover and protect the OLED. The protection layer 115 may include an inorganic insulating layer and/or an organic insulating layer. The inorganic insulating layer may include $SiO_2$, $SiN_x$, $SiON$, $Al_2O_3$, $TiO_2$, $Ta_2O_5$, $HfO_2$, $ZrO_2$, BST, PZT, etc. The organic insulating layer may include general purpose polymers, such as (PMMA) and (PS), polymer derivatives having a phenolic group, acrylic polymers, imide polymers, aryl ether polymers, amide polymers, fluorinated polymers, p-xylene polymers, vinyl alcohol polymers, and their blends. The protection layer 115 may be deposited by various deposition methods, such as PECVD, APCVD, LPCVD, and the like. The protection layer 115 is not necessarily indispensable, and may be omitted according to circumstances.

The moisture absorbent 520 may be located at one or more sides of, or may surround, the display panel 110. The moisture absorbent 520 may function to extend a lifespan of the OLED by reducing an amount of moisture and oxygen that easily react with the OLED. The moisture absorbent 520 may be formed of one selected from the group consisting of alkali metal oxides, alkaline earth metal oxides, metal halides, lithium sulfate, metal sulfate, metal perchlorate, silica gel, and phosphorus pentoxide, and any combinations thereof. A type and location of the moisture absorbent 520 is not limited thereto.

Figure 6:
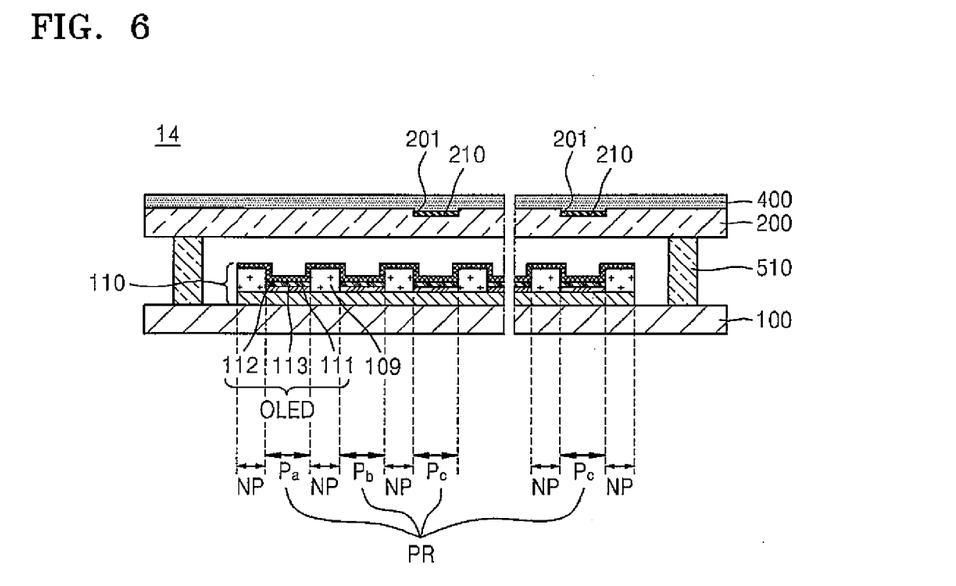
FIG. 6 is a schematic cross-sectional view of an organic light-emitting display apparatus according to another embodiment of the present invention.

FIG. 6 is a schematic cross-sectional view of an organic light-emitting display apparatus 14 according to another embodiment of the present invention. The reference numerals of FIG. 6 that are the same as those of FIG. 1 denote the same elements as those of FIG. 1, and thus redundant descriptions thereof are omitted for brevity of explanation.

Referring to FIG. 6, the organic light-emitting display apparatus 14 of the present embodiment is different from the organic light-emitting display apparatus 10 of FIG. 1 in that the organic light-emitting display apparatus 14 of the present embodiment further includes a polarizing film 400 provided on the encapsulation substrate 200.

The polarizing film 400 may function to increase a color reproduction and/or an image definition by reducing reflection of external light. The polarizing film 400 may include a single layer or multilayers, and may include a polarizing layer, a support layer, and an adhesive layer.

The polarizing film 400 may function to polarize light incident from a light source as light in the same direction as that of a polarizing axis. In some embodiments, the polarizing film 400 may be formed by adding a polarizer and/or a dichroic dye to a polyvinyl alcohol (PVA) film. The dichroic dye may be iodine molecules and/or pigment molecules. In some embodiments, the polarizing film 400 may be a circular polarizing film.

Figure 7:
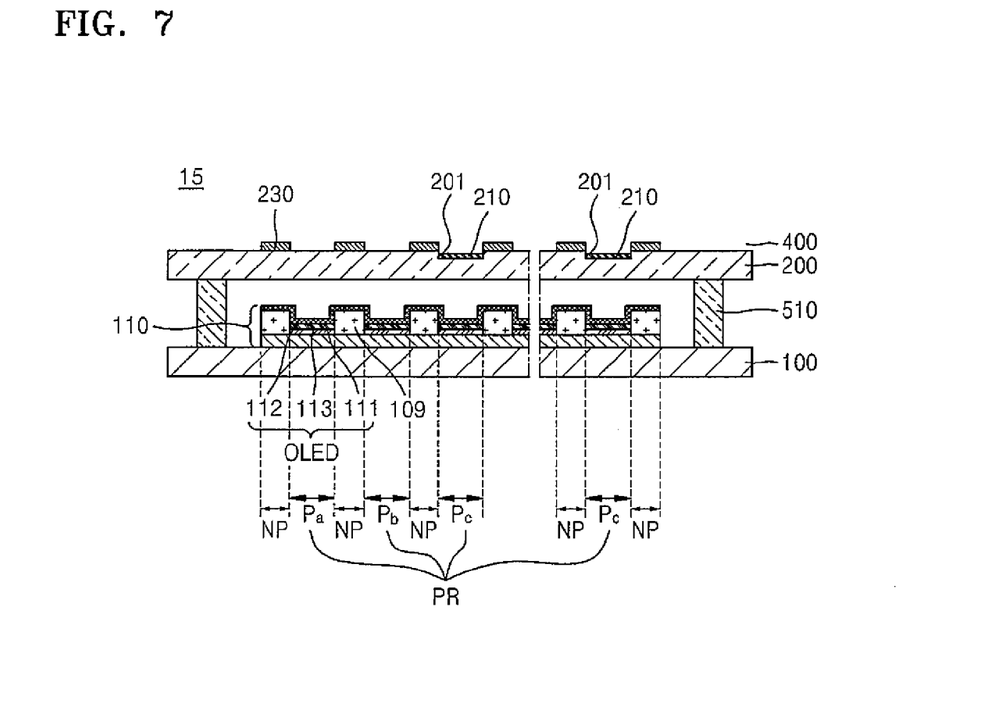
FIG. 7 is a schematic cross-sectional view of an organic light-emitting display apparatus according to another embodiment of the present invention.

FIG. 7 is a schematic cross-sectional view of an organic light-emitting display apparatus 15 according to another embodiment of the present invention. The reference numerals of FIG. 7 that are the same as those of FIG. 1 denote the same elements as those of FIG. 1, and thus redundant descriptions thereof are omitted for brevity of explanation.

Referring to FIG. 7, the organic light-emitting display apparatus 15 of the present embodiment is different from the organic light-emitting display apparatus 10 of FIG. 1 in that the organic light-emitting display apparatus 15 of the present embodiment further includes a black matrix 230 provided on the encapsulation substrate 200.

The black matrix 230 may correspond to a non-pixel region(s) NP. The black matrix 230 may function to absorb invisible rays incident from the outside, to reduce or prevent the invisible rays from the pixel regions PR from mixing and interfering, and to enhance contrast of the organic light-emitting display apparatus 15. The black matrix 230 may be formed of a material, such as Cr or CrOx, Cr/CrOx, Cr/CrOx/CrNy, resin (a carbon pigment and an RGB mixture pigment), and graphite. The black matrix 230 may be formed through a photolithography process after coating a black material (e.g., such that the black material has a predetermined pattern), although the present invention is not limited thereto. The black matrix 230 may be formed through various processes, such as a roller printing process.

FIGS. 8A through 8F are cross-sectional views for sequentially explaining a method of manufacturing the organic light-emitting display apparatuses of embodiments of the present invention (e.g., organic light-emitting display apparatuses 10, 11, 12, 13, 14, and 15), according to embodiments of the present invention. A process of manufacturing the organic light-emitting display apparatus 10 will now be described in the present embodiment.

Figure 8A:
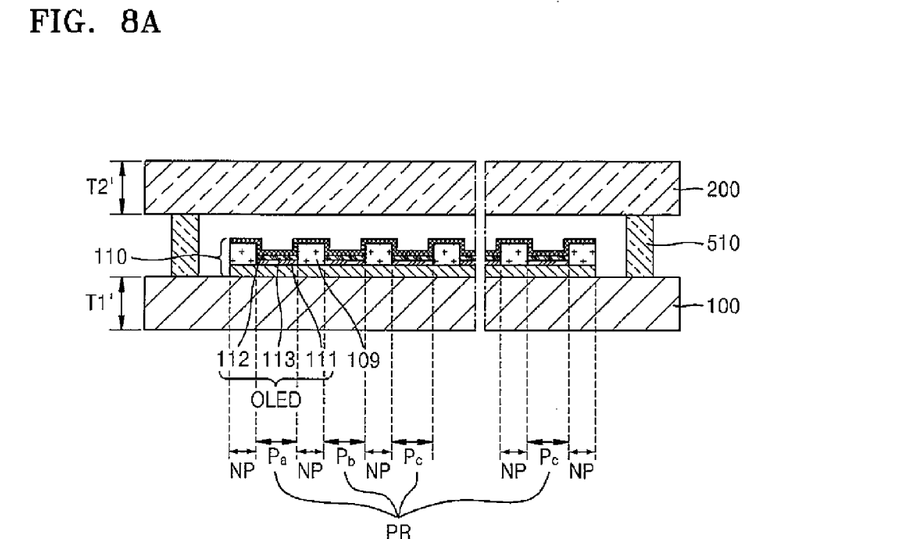
FIGS. 8A through 8F are cross-sectional views for sequentially explaining a method of manufacturing organic light-emitting display apparatuses, according to embodiments of the present invention.

Referring to FIG. 8A, the display panel 110 is formed on the display substrate 100. The display panel 110 includes the pixel regions PR, in which the OLED is provided, and a non-pixel region NP, which separates the pixel regions PR from each other. Various deposition methods may be used to form the OLED included in the display panel 110.

Thereafter, the display substrate 100, on which the display panel 110 is formed, and the encapsulation substrate 200 are bonded to each other. To bond the display substrate 100 and the encapsulation substrate 200 to each other, the encapsulation member 510 is coated on the display substrate 100 to surround the display panel 110, and then the display substrate 100 and the encapsulation substrate 200 are positioned to face each other. Thereafter, infrared rays are irradiated, or heat is applied, to a region of the display substrate 100 or the encapsulation substrate 200 corresponding to a position of the encapsulation member 510, and then the encapsulation member 510 is hardened. Thus, the display substrate 100 and the encapsulation substrate 200 are completely bonded to each other.

In this regard, an initial thickness of the display substrate 100 may be T1', and an initial thickness of the encapsulation substrate 200 may be T2'. In some embodiments, T1' and/or T2' may have a value in the range of about 0.5 mm to about 1 mm.

Figure 8B:
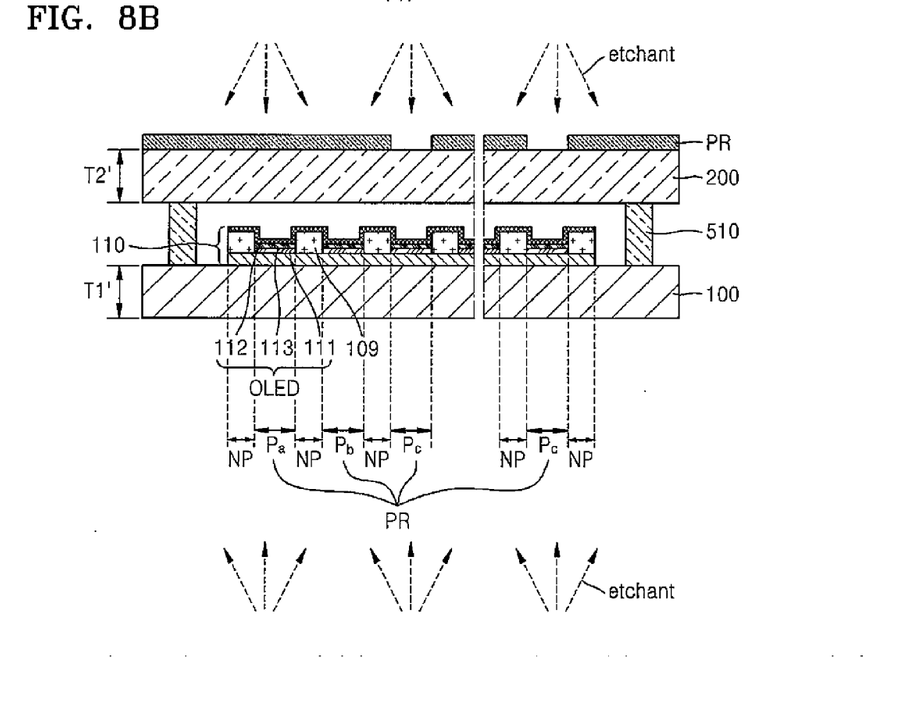
Figure 8C:
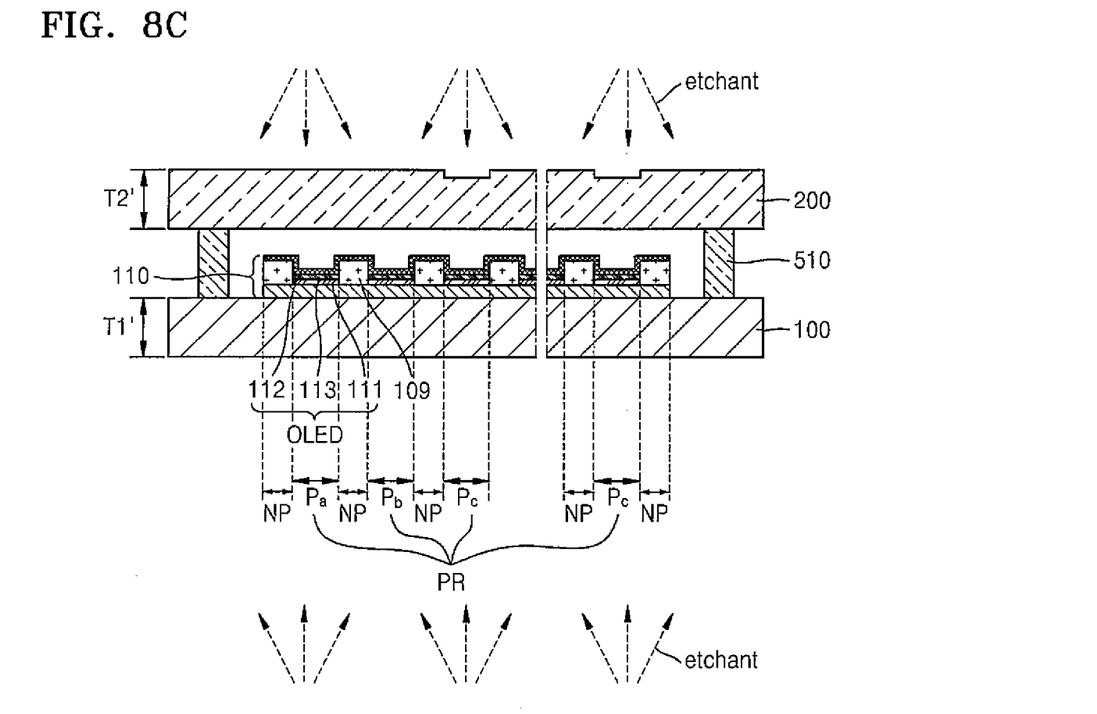

Referring to FIG. 8B, a photoresist (PR) pattern is formed to form the groove 201 in the encapsulation substrate 200 (see FIG. 8C). The PR pattern may be formed through a mask exposure process after coating PR on the encapsulation substrate 200.

Thereafter, the groove 201 may be formed in the encapsulation substrate 200 through an etching process. The etching process may be a wet etching process or dry etching process. In some embodiments, a dip method of dipping the display substrate 100 and the encapsulation substrate 200 into a dip bath containing an etching liquid, and/or a spray method of spraying the etching liquid onto the display substrate 100 and the encapsulation substrate 200, may be used to form the groove 201.

Referring to FIG. 8C, if the groove 201 is formed in the encapsulation substrate 200, the remaining PR pattern may be removed, although the present invention is not limited thereto. In some embodiments, a thickness of the PR may be determined in consideration of an etching rate of the PR, such that the PR pattern may be etched by the etching liquid when the groove 201 is formed in the encapsulation substrate 200, thereby allowing for the process of removing the PR pattern to be omitted.

Thereafter, a slimming process of reducing thicknesses of the display substrate 100 and the encapsulation substrate 200 may be performed. The slimming process may use the dip method of dipping the display substrate 100 and the encapsulation substrate 200 that are bonded to each other in the dip bath containing the etching liquid, and/or the spray method of spraying the etching liquid onto the display substrate 100 and the encapsulation substrate 200. In some embodiments, the etching liquid may include hydrofluoric acid (HF).

Figure 8D:
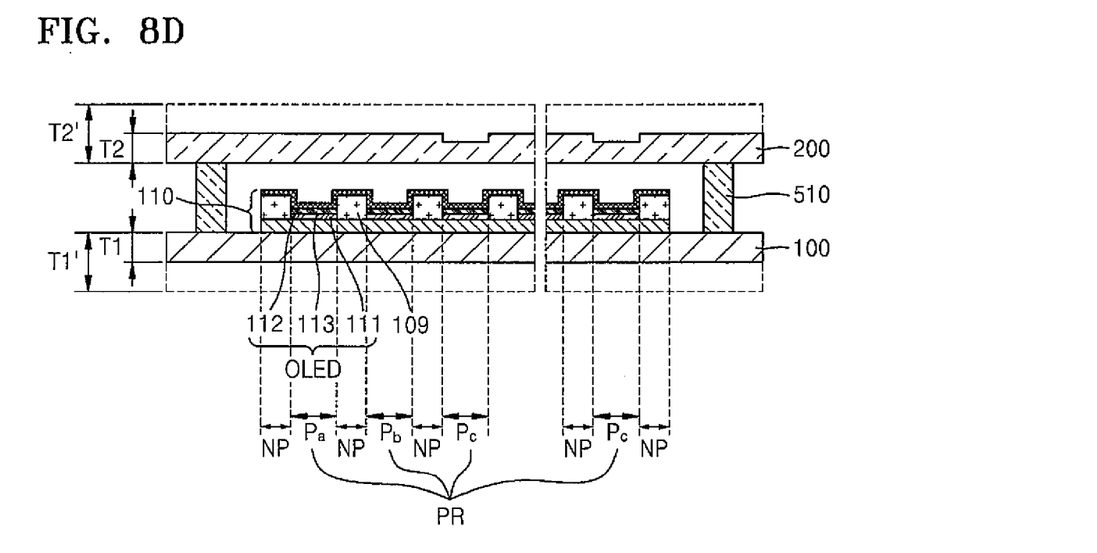

Referring to FIG. 8D, a thickness T1 of the display substrate 100 and a thickness T2 of the encapsulation substrate 200 may respectively be from about 40% to about 60% of the initial thicknesses T1' and T2' through the slimming process. In some embodiments, the thickness T1 of the display substrate 100 and the thickness T2 of the encapsulation substrate 200 may be in a range of about 0.2 mm to about 0.5 mm. The organic light-emitting display apparatus 10 may be lightweight and thin through the slimming process.

In some embodiments, the process of forming the groove 201 and the slimming process may be simultaneously performed (or performed at about the same time) when the thickness of the PR is determined in consideration of the etching rate of the PR such that the PR pattern may be completely etched when reaching an intended depth of the groove 201.

In some embodiments, the depth of the groove 201 may be in a range of about 0.1 um to about 1000 um.

Figure 8E:
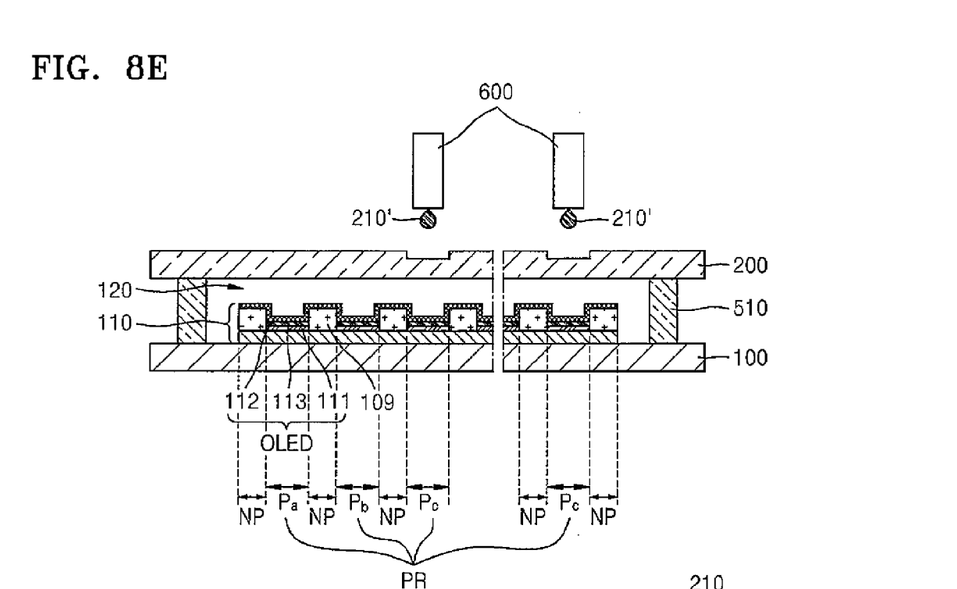
Figure 8F:
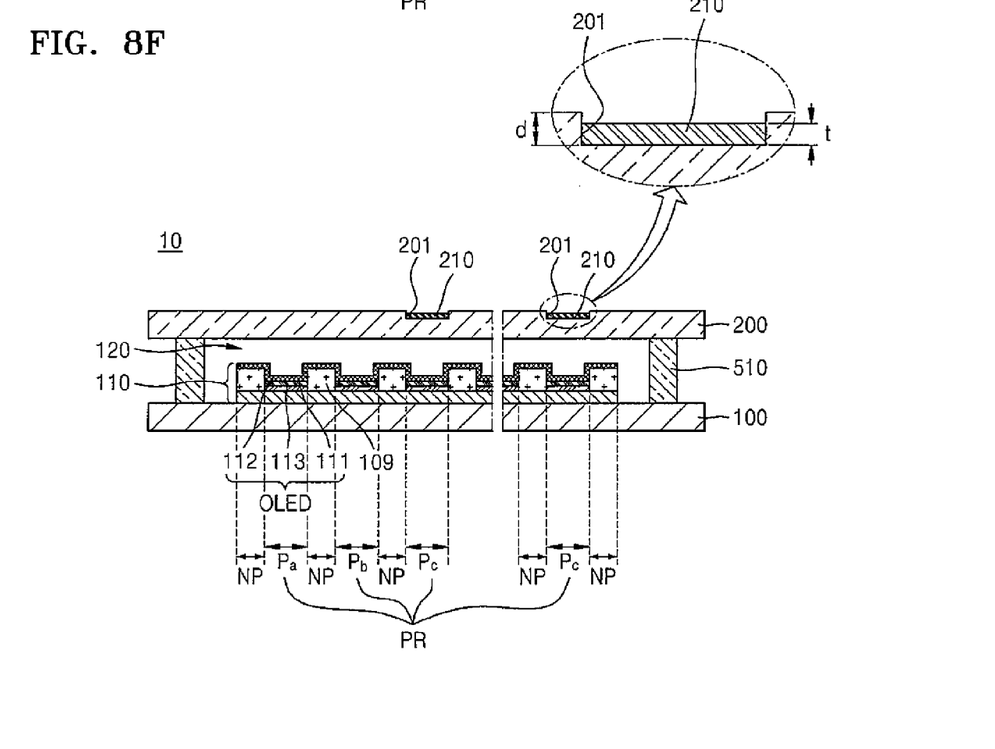

Referring to FIG. 8E, the color filter 210 of FIG. 8F is formed in the groove 201 of the encapsulation substrate 200. The color filter 210 may be formed by using various filling methods.

In some embodiments, the color filter 210 may be formed by using an inkjet printing method. The color filter 210 of FIG. 8F may be completely formed by selectively dropping a liquid color filter solution 210' into the groove 201 of the encapsulation substrate 200 by using an inkjet or a nozzle coating apparatus 600, and by filling and hardening the liquid color filter solution 210' in the groove 201. A thickness of the color filter 210 may be different from the depth of the groove 201. The thickness of the color filter 210 may be non-uniform. For example, the color filter 210 may have a concave shape or a convex shape.

Although a process of manufacturing the organic light-emitting display apparatus 10 of FIG. 1 is sequentially explained, the process may be modified in various ways. For example, the grooves 201 and 202 and the color filters 210 may be formed in the encapsulation substrate 200 before bonding the display substrate 100 and the encapsulation substrate 200 to each other. Also, the slimming process may be performed before bonding the display substrate 100 and the encapsulation substrate 200 to each other, and may be performed by using a carrier substrate.

As described above, according to one or more of the above embodiments of the present invention, an encapsulation substrate of an organic light-emitting display apparatus includes a groove in which a color filter is located. The color filter may be selectively located according to a pixel type. Accordingly, a color reproduction of the organic light-emitting display apparatus may be enhanced.

The color filter may be located outside (e.g., on an exterior of the encapsulation substrate) to prevent an organic material forming the color filter from influencing an OLED.

The color filter is included in the encapsulation substrate instead of as a separate member, and thus a lightweight and thin organic light-emitting display apparatus may be achieved.

It should be understood that the exemplary embodiments described herein should be considered in a descriptive sense only, and should not be considered for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims, and their equivalents.

What is claimed is:

1. An organic light-emitting display apparatus comprising:
a display substrate;
a display panel on the display substrate and comprising a pixel region comprising an organic light-emitting device (OLED), and a non-pixel region;
an encapsulation member and surrounding the display panel with an inner space between the display panel and the encapsulation member; and
an encapsulation substrate extending across both the display panel and the encapsulation member for encapsulating the display panel, the encapsulation substrate comprising a first surface facing the display panel and a second surface opposite to the first surface, the first surface being flat, and the second surface having at least one groove in which a color filter is located,
wherein the pixel region comprises sub pixels,
wherein the at least one groove is located in the encapsulation substrate corresponding to some of the sub pixels and not located in the encapsulation substrate corresponding to the rest of the sub pixels.

2. The organic light-emitting display apparatus of claim 1, wherein the pixel region comprises a first pixel, a second pixel, and a third pixel, the first, second, and third pixels being configured to emit light of different colors, and
wherein the at least one groove corresponds to the first pixel, the second pixel, or the third pixel.

3. The organic light-emitting display apparatus of claim 2, further comprising a color filter corresponding to the color emitted by the first pixel located in the at least one groove,
wherein the at least one groove is above the first pixel.

4. The organic light-emitting display apparatus of claim 3, wherein the first pixel is a blue pixel.

5. The organic light-emitting display apparatus of claim 2, wherein the at least one groove comprises a first groove corresponding to the first pixel, a second groove corresponding to the second pixel, and a third groove corresponding to the third pixel, and
wherein color filters respectively corresponding to the colors emitted by the first pixel, the second pixel, and the third pixel are located in the first groove, the second groove, and the third groove, respectively.

6. The organic light-emitting display apparatus of claim 1, wherein the at least one groove is defined by an exterior of the encapsulation substrate.

7. The organic light-emitting display apparatus of claim 1, further comprising a black matrix corresponding to the non-pixel region located on the encapsulation substrate.

8. The organic light-emitting display apparatus of claim 1, further comprising a polarizing film on the encapsulation substrate.

9. The organic light-emitting display apparatus of claim 1, wherein the encapsulation member bonds the display substrate to the encapsulation substrate.

10. The organic light-emitting display apparatus of claim 1, further comprising a moisture absorbent at a side of the display panel.

11. The organic light-emitting display apparatus of claim 1, wherein a depth of the at least one groove is in a range of about 0.1 um to about 1000 um.

12. A method of manufacturing an organic light-emitting display apparatus, the method comprising:
    forming a display panel on a display substrate;
    forming an encapsulation member to surround the display panel with an inner space between the display panel and the encapsulation member;
    bonding the display substrate to an encapsulation substrate, wherein the encapsulation substrate extends across both the display panel and the encapsulation member, the encapsulation substrate comprising a first surface facing the display panel and a second surface opposed to the first surface, and the first surface being flat;
    forming at least one groove in the second surface of the encapsulation substrate; and
    forming at least one color filter in the at least one groove,
    wherein the display panel comprises a pixel region comprising an OLED, and a non-pixel region and the pixel region comprises sub pixels,
    wherein the at least one groove is located in the encapsulation substrate corresponding to some of the sub pixels and not located in the encapsulation substrate corresponding to the rest of the sub pixels.

13. The method of claim 12, wherein the pixel region comprises a first pixel, a second pixel, and a third pixel,
    wherein the first, second, and third pixels are configured to emit different colors, and
    wherein the groove corresponds to the first pixel, the second pixel, or the third pixel.

14. The method of claim 12, wherein forming the groove comprises wet etching.

15. The method of claim 12, further comprising performing a slimming operation for reducing thicknesses of the display substrate and the encapsulation substrate.

16. The method of claim 15, wherein forming the groove and performing the slimming operation occur substantially simultaneously.

17. The method of claim 15, wherein performing the slimming operation comprises reducing the thicknesses of the display substrate and the encapsulation substrate by about 40% to about 60%.

18. The method of claim 12, wherein forming the color filter comprises an inkjet printing method.

19. The method of claim 12, wherein bonding the display substrate to the encapsulation substrate comprises:
    coating the encapsulation member on the display substrate;
    orienting the display substrate and the encapsulation substrate to face each other; and irradiating laser onto a region of the encapsulation substrate corresponding to the encapsulation member.

* * * * *